United States Patent
Chen et al.

(10) Patent No.: US 9,316,682 B1
(45) Date of Patent: Apr. 19, 2016

(54) FAULT DIAGNOSIS METHOD FOR FREEWHEELING DIODES OF DUAL-SWITCH POWER CONVERTER OF SWITCHED RELUCTANCE MOTOR

(71) Applicant: CHINA UNIVERSITY OF MINING AND TECHNOLOGY, Jiangsu (CN)

(72) Inventors: Hao Chen, Jiangsu (CN); Xing Wang, Jiangsu (CN)

(73) Assignee: CHINA UNIVERSITY OF MINING AND TECHNOLOGY (CN)

( * ) Notice: Subject to any disclaimer, the term of this patent is extended or adjusted under 35 U.S.C. 154(b) by 0 days.

(21) Appl. No.: 14/351,528

(22) PCT Filed: Apr. 19, 2013

(86) PCT No.: PCT/CN2013/074449
§ 371 (c)(1),
(2) Date: Apr. 11, 2014

(87) PCT Pub. No.: WO2014/114036
PCT Pub. Date: Jul. 31, 2014

(30) Foreign Application Priority Data

Jan. 28, 2013 (CN) .......................... 2013 1 0030343

(51) Int. Cl.
*G01R 31/00* (2006.01)
*G01R 31/26* (2014.01)
(Continued)

(52) U.S. Cl.
CPC ............ *G01R 31/2632* (2013.01); *G01R 31/34* (2013.01); *G01R 31/40* (2013.01)

(58) Field of Classification Search
CPC .................................................. G01R 31/2632
See application file for complete search history.

(56) References Cited

U.S. PATENT DOCUMENTS

| 4,186,391 | A | * | 1/1980 | Wang | ................... | H02H 7/1255 |
| | | | | | | 340/645 |
| 6,342,791 | B1 | * | 1/2002 | Ichikawa | ........... | G01R 31/2632 |
| | | | | | | 324/762.07 |

(Continued)

FOREIGN PATENT DOCUMENTS

| CN | 101078747 | 11/2007 | ............. G01R 31/06 |
| CN | 101666858 | 3/2010 | ........... G01R 31/327 |

(Continued)

OTHER PUBLICATIONS

International Search Report issued in corresponding PCT Patent Appln. Serial No. PCT/CN/2013/074449 dated Sep. 5, 2013, with English translation (8 pgs).

*Primary Examiner* — Patrick Assouad
*Assistant Examiner* — Demetrius Pretlow
(74) *Attorney, Agent, or Firm* — Hayes Soloway P.C.

(57) ABSTRACT

A fault diagnosis method for freewheeling diodes of power converter of switched reluctance motor with two main switches per phase, in which two current sensors are arranged on a power converter with two main switches per phase, wherein, one current sensor LEM1 detects the total current of the main switches connected to the DC bus, and the other current sensor LEM2 detects the total feedback current of the freewheeling diodes connected to the DC bus. By controlling ON/OFF of the upper and lower main switch tubes, short circuit fault of the upper freewheeling diode, short circuit fault of the lower freewheeling diode, short circuit fault of both the upper freewheeling diode and the lower freewheeling diode, open circuit fault of the upper freewheeling diode, open circuit fault of the lower freewheeling diode, or open circuit fault of both the upper freewheeling diode and the lower freewheeling diode can be determined.

1 Claim, 3 Drawing Sheets

(51) Int. Cl.
*G01R 31/40* (2014.01)
*G01R 31/34* (2006.01)

(56) References Cited

U.S. PATENT DOCUMENTS

2009/0296777 A1* 12/2009 Fish .................... H02P 29/0088
374/152
2010/0039735 A1* 2/2010 Trescases ............ H02M 3/1588
361/18
2010/0289518 A1* 11/2010 Huang ................ G01R 31/2635
324/762.07
2011/0025369 A1* 2/2011 Quarto ................. G01R 31/343
324/765.01
2011/0309874 A1* 12/2011 Takimoto ............ H03K 17/0814
327/427
2012/0020124 A1* 1/2012 Minamii .............. H02H 7/1225
363/53

FOREIGN PATENT DOCUMENTS

| CN | 102033188 | 4/2011 | ............. G01R 31/02 |
| JP | 08-242589 | 9/1996 | ............. H02M 7/48 |

* cited by examiner

FAULT DIAGNOSIS METHOD FOR FREEWHEELING DIODES OF DUAL-SWITCH POWER CONVERTER OF SWITCHED RELUCTANCE MOTOR

FIELD OF THE INVENTION

The present invention relates to a fault diagnosis method for freewheeling diodes of power converter of switched reluctance motor, which is applicable to a power converter of a reluctance motor with two main switches per phase and any number of phases.

BACKGROUND OF THE INVENTION

A power converter of a reluctance motor with two main switches per phase is a unipolar power converter, which supplies unipolar electric current to the switched reluctance motor. In a severe environment, the power converter of switched reluctance motor is liable to break down. In contrast, with a power converter of a reluctance motor with two main switches per phase, the motor magnetic circuit and the system circuit in the switched reluctance motor system are independent from each other, therefore, when any faults happen to the switched reluctance motor system, fault tolerant measures can be taken to ensure that the switched reluctance motor system operates reliably in a severe environment. Freewheeling diode is one of the important components of the power converter of a switched reluctance motor as well as an important assurance for phase commutation of the switched reluctance motor and current commutation of the main switches. At present, the existing power converters of reluctance motor with two main switches per phase do not have fault detecting and fault locating functions for freewheeling diode, as a result, when any faults happen to the freewheeling diode of the power converter, the system can not determine the fault type of the freewheeling diode and can not locate the fault. Whereas, detecting and locating faults of freewheeling diodes of the power converter of a switched reluctance motor timely and reliably is an assurance for fault-tolerant operation of the switched reluctance motor system.

DISCLOSURE OF THE INVENTION

Technical Problem

To overcome the drawbacks in the prior art, the present invention provides a fault diagnosis method for freewheeling diodes of power converter of switched reluctance motor with two main switches per phase, which is simple and easy to use, and can detect and locate faults reliably and quickly.

Solution to the Problem

Technical Solution

The fault diagnosis method for freewheeling diodes in the present invention can be described as follows: a fault diagnosis method for freewheeling diodes of power converter of switched reluctance motor with two main switches per phase, which comprises arranging two current sensors on a power converter with two main switches per phase, wherein, one current sensor LEM1 is used to detect the total current of the main switches connected to the DC bus, and the other current sensor LEM2 is used to detect the total feedback current of the freewheeling diodes connected to the DC bus, wherein:

(1) supplying power to the power converter, and keeping both the upper main switch tube and the lower main switch tube operating normally without fault; if neither the upper main switch tube nor the lower main switch tube is in ON state, the current sensor LEM1 and the current sensor LEM2 will detect no current;
 (a) keeping the lower main switch tube of one phase in ON state only, if the current detected by the current sensor LEM1 exceeds a preset value, it indicates the upper freewheeling diode of the phase has short circuit fault;
 (b) keeping the upper main switch tube of the phase in ON state only, if the current detected by the current sensor LEM2 exceeds the preset value, it indicates the lower freewheeling diode of the phase has short circuit fault;

(2) supplying power to the power converter, and keeping both the upper main switch tube and the lower main switch tube operating normally without fault; if neither the upper main switch tube nor the lower main switch tube is in ON state, but the current detected by the current sensor LEM2 exceeds the preset value, it indicates both the upper freewheeling diode and the lower freewheeling diode have short circuit fault;

(3) supplying power to the power converter, switching on both the upper main switch tube and the lower main switch tube at the same time first, and then switching off both the upper main switch tube and the lower main switch tube at the same time, if the current sensor LEM2 detects no forward current and no reverse current, then, switching on both the upper main switch tube and the lower main switch tube at the same time and performing as follows:
 (a) switching off the upper main switch tube only, if the current sensor LEM2 detects reverse current, it indicates the upper freewheeling diode has open circuit fault;
 (b) switching off the upper main switch tube only, if the current sensor LEM2 detects no forward current and no reverse current, it indicates the lower freewheeling diode has open circuit fault, or both the upper freewheeling diode and the lower freewheeling diode have open circuit faults.

Beneficial Effects of the Invention

Beneficial Effects

With the method described above, the present invention can diagnose short circuit and open circuit faults of freewheeling diodes of the power converter of a reluctance motor with two main switches per phase and any number of phases. The method provided in the present invention not only can be used for fault detection, fault type identification, and fault locating in case of faults of the freewheeling diodes in one phase of such power converters, but also can be used for fault detection, fault type identification, and fault locating in case of faults of freewheeling diodes in two or more phases of such power converters. The method can be used to detect faults of freewheeling diodes of power converter of switched reluctance motor with two main switches per phase, identify the fault type and locate the phase involved in the faults quickly and accurately, and has strong robustness; in addition, the fault detection and locating is reliable, the diagnosis is quick and can be implemented in a microcomputer, single-chip or DSP system. The method is an important assurance for fault-tolerant operation of a switched reluctance motor system, and has high cost-performance, high practicability, favorable effect and broad application prospects.

BRIEF DESCRIPTION OF THE DRAWINGS

Description of the Drawings

Figure 1:
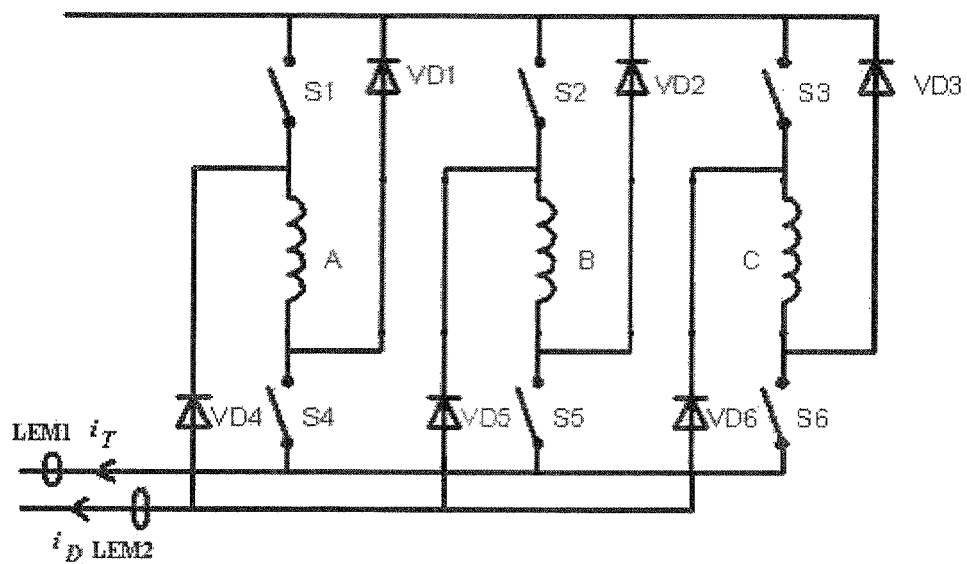
Figure 2:
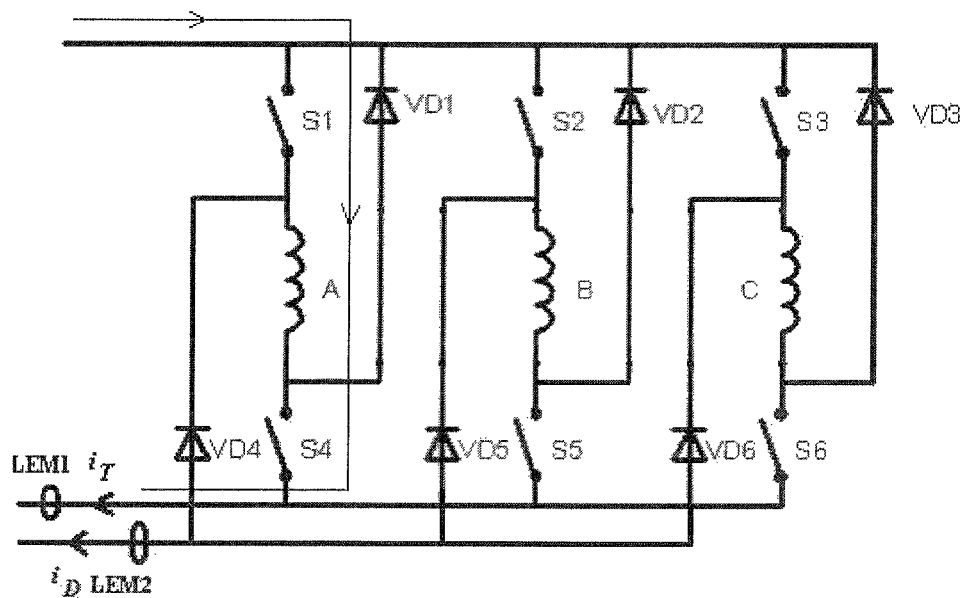
Figure 3:
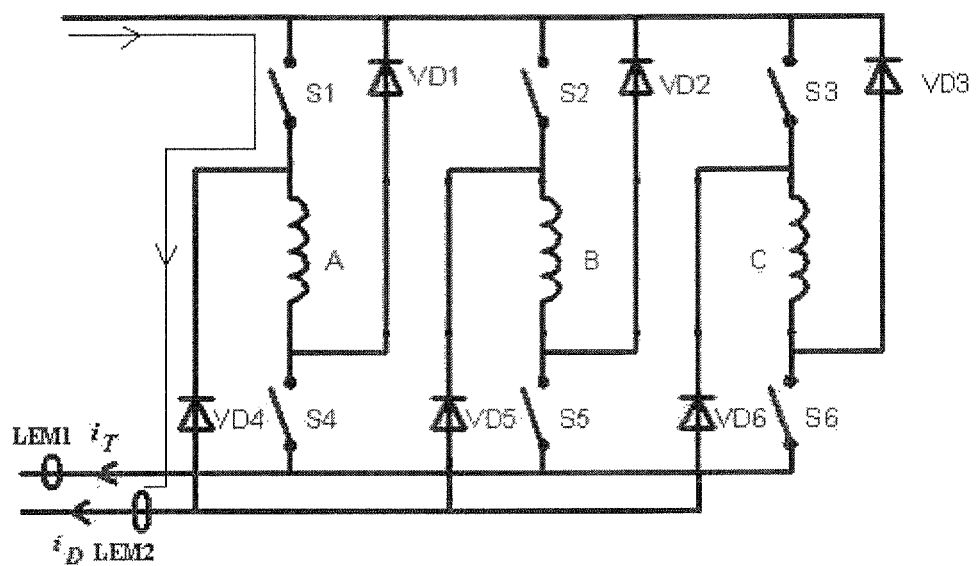
Figure 4:
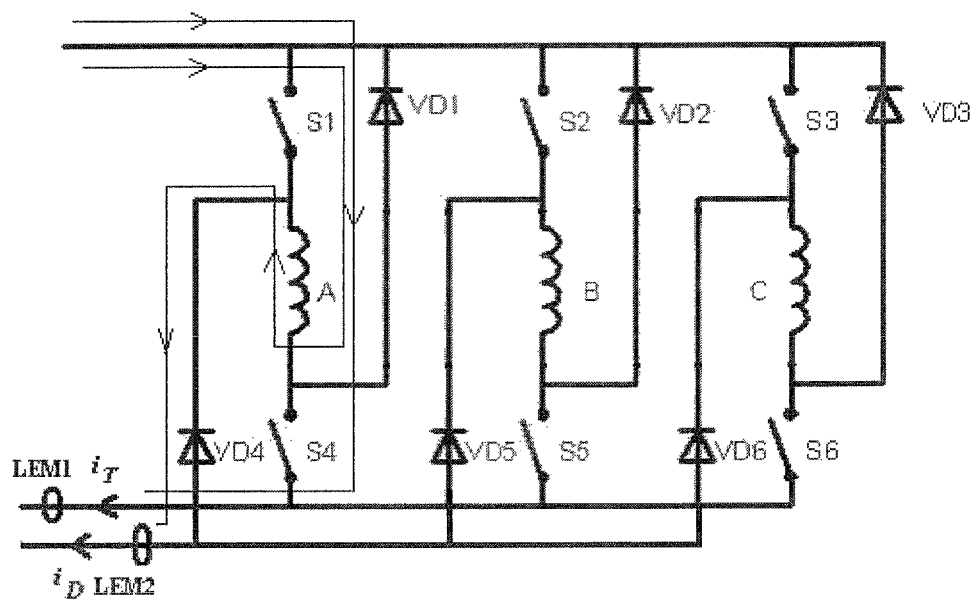
Figure 5:
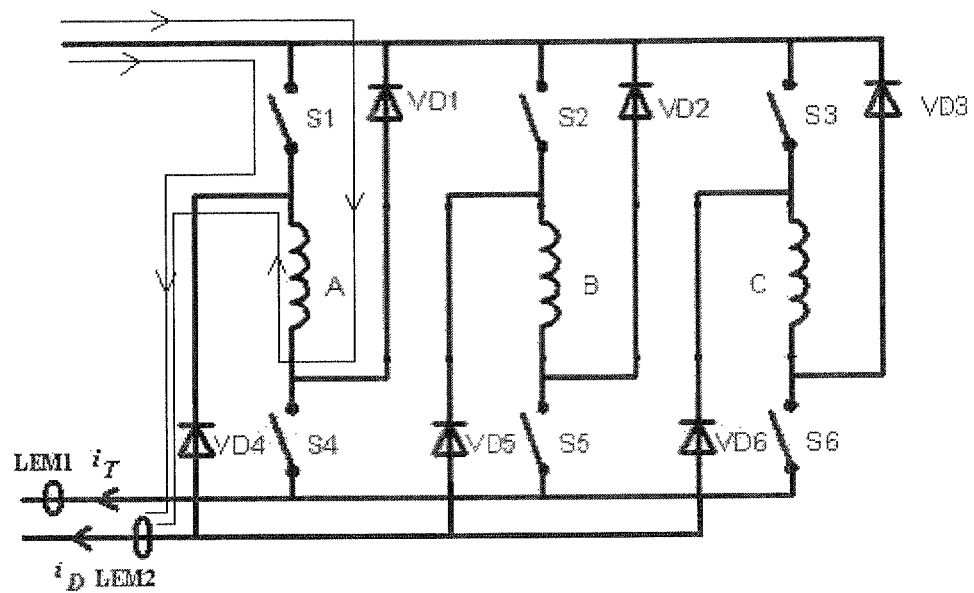
Figure 6:
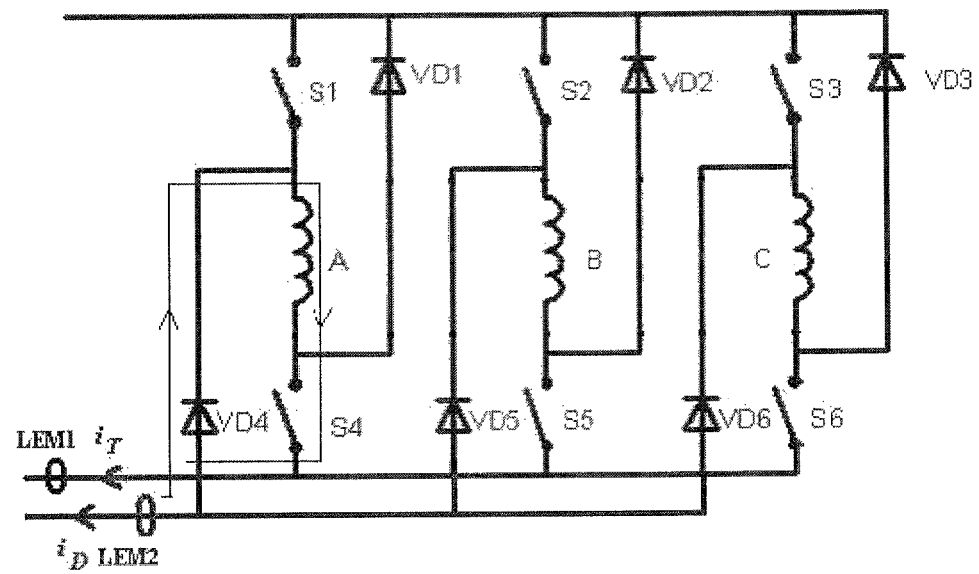

FIG. 1 is a schematic diagram of arrangement of two current sensors LEM1 and LEM2 on a power converter with two main switches per phase in the present invention;

FIG. 2 is a schematic diagram of the current flow path when the upper freewheeling diode VD1 in phase A has short circuit fault and the lower main switch tube S4 in phase A is in ON state;

FIG. 3 is a schematic diagram of the current flow path when the lower freewheeling diode VD4 of phase A has short circuit fault and the upper main switch tube S1 of phase A is in ON state;

FIG. 4 is a schematic diagram of the current flow path when both the upper freewheeling diode VD1 and the lower freewheeling diode VD4 of phase A have short circuit faults and the lower main switch tube S4 of phase A is in ON state;

FIG. 5 is a schematic diagram of the current flow path when both the upper freewheeling diode VD1 and the lower freewheeling diode VD4 of phase A have short circuit faults and the upper main switch tube S1 of phase A is in ON state;

FIG. 6 shows the current flow path when the lower main switch tube S4 and lower freewheeling diode VD4 of phase A are in ON state.

EMBODIMENTS OF THE PRESENT INVENTION

Detailed Description of the Embodiments

Hereunder the present invention will be detailed in embodiments with reference to the accompanying drawings:

In an example of the power converter of a three-phase switched reluctance motor with two main switches per phase, the diode fault diagnosis method in the present invention is:

As shown in FIG. 1, two current sensors are arranged on the power converter with two main switches per phase, wherein, one current sensor LEM1 is used to detect the total current iT of the main switches connected to the DC bus, and the other current sensor LEM2 is used to detect the total current iD of the lower freewheeling diodes connected to the DC bus, the direction of arrow in the diagram indicates the forward current direction. For example, for phase A, power is supplied to the power converter, both the upper main switch tube and the lower main switch tube operate normally without fault; if neither the upper main switch tube nor the lower main switch tube is in ON state, the current sensor LEM1 and the current sensor LEM2 will detect no current;

As shown in FIG. 2, the lower main switch tube S4 of phase A is kept in ON state only; if the current iT detected by the current sensor LEM1 exceeds a preset value, it indicates the upper freewheeling diode VD1 of the phase A has short circuit fault;

As shown in FIG. 3, the upper main switch tube $S_1$ of phase A is kept in ON state only; if the current iD detected by the current sensor LEM2 exceeds the preset value, it indicates the lower freewheeling diode VD4 of the phase A has short circuit fault;

Power is supplied to the power converter, and keep both the upper main switch tube and the lower main switch tube operate normally without fault; if neither the upper main switch tube S1 nor the lower main switch tube S4 is in ON state, but the current iD detected by the current sensor LEM2 exceeds the preset value, it indicates both the upper freewheeling diode and the lower freewheeling diode have short circuit fault; for example, for phase A:

As shown in FIG. 4, the lower main switch tube S4 of phase A is kept in ON state only; if the current iT detected by the current sensor LEM1 exceeds the preset value, it indicates the upper freewheeling diode VD1 of the phase A has short circuit fault;

As shown in FIG. 5, the upper main switch tube S1 of phase A is kept in ON state only; if the over current iD detected by the current sensor LEM2 increases further, it indicates the lower freewheeling diode VD4 of the phase A has short circuit fault;

Power is supplied to the power converter, for example, for phase A, both the upper main switch tube S1 and the lower main switch tube S4 are switched on at the same time first, and then both the upper main switch tube S1 and the lower main switch tube S4 are switched off at the same time; if the current sensor LEM2 detects no forward current and no reverse current, then both the upper main switch tube S1 and the lower main switch tube S4 are switched on at the same time and the two following tests are carried out:

As shown in FIG. 6, the upper main switch tube S1 is switched off only; if the current sensor LEM2 detects reverse current iD, it indicates the upper freewheeling diode VD1 has open circuit fault;

The upper main switch tube S1 is switched off only; if the current sensor LEM2 detects no forward current and no reverse current, it indicates the lower freewheeling diode VD4 has open circuit fault, or both the upper freewheeling diode VD1 and the lower freewheeling diode VD4 have open circuit faults.

The fault detection, fault type identification, and fault locating method for short circuit and open circuit faults of upper freewheeling diode VD2 and lower freewheeling diode VD5 of phase B of the power converter of switched reluctance motor is the same as the method for phase A of the power converter of switched reluctance motor, and therefore is omitted here.

The fault detection, fault type identification, and fault locating method for short circuit and open circuit faults of upper freewheeling diode VD3 and lower freewheeling diode VD6 of phase C of the power converter of switched reluctance motor is the same as the method for phase A of the power converter of switched reluctance motor, and therefore is omitted here.

The fault detection, fault type identification, and fault locating method for short circuit and open circuit faults of upper freewheeling diode and lower freewheeling diode of two or more phases of the power converter of switched reluctance motor is similar to the method described above.

The invention claimed is:

1. A fault diagnosis method for freewheeling diodes of power converter of a switched reluctance motor with two main switch tubes per phase, comprising arranging two current sensors on a power converter with the two main switch tubes per phase, wherein, one current sensor LEM1 is used to detect the total current of the two main switch tubes connected to a DC bus, and the other current sensor LEM2 is used to detect the total feedback current of the freewheeling diodes connected to the DC bus, wherein:

(1) supplying power to the power converter, and keeping both an upper main switch tube and a lower main switch tube operating normally without fault; if neither the upper main switch tube nor the lower main switch tube is in ON state, the current sensor LEM1 and the current sensor LEM2 will detect no current;

(a) keeping the lower main switch tube of one phase in ON state only; if the current detected by the current sensor LEM1 exceeds a preset value, it indicates the upper freewheeling diode of the phase has short circuit fault;

(b) keeping the upper main switch tube of the phase in ON state only; if the current detected by the current sensor LEM2 exceeds the preset value, it indicates the lower freewheeling diode of the phase has short circuit fault;

(2) supplying power to the power converter, and keeping both the upper main switch tube and the lower main switch tube operating normally without fault; if neither the upper main switch tube nor the lower main switch tube is in ON state, but the current detected by the current sensor LEM2 exceeds the preset value, it indicates both the upper freewheeling diode and the lower freewheeling diode have short circuit faults;

(3) supplying power to the power converter, switching on both the upper main switch tube and the lower main switch tube at the same time first, and then switching off both the upper main switch tube and the lower main switch tube at the same time; if the current sensor LEM2 detects no forward current and no reverse current, then, switching on both the upper main switch tube and the lower main switch tube at the same time and performing as follows:

(a) switching off the upper main switch tube only; if the current sensor LEM2 detects reverse current, it indicates the upper freewheeling diode has open circuit fault;

(b) switching off the upper main switch tube only; if the current sensor LEM2 detects no forward current and no reverse current, it indicates the lower freewheeling diode has open circuit fault, or both the upper freewheeling diode and the lower freewheeling diode have open circuit faults.

* * * * *